US006204203B1

(12) United States Patent
Narwankar et al.

(10) Patent No.: US 6,204,203 B1
(45) Date of Patent: Mar. 20, 2001

(54) POST DEPOSITION TREATMENT OF DIELECTRIC FILMS FOR INTERFACE CONTROL

(75) Inventors: Pravin K. Narwankar, Sunnyvale; Turgut Sahin, Cupertino; Gregory F. Redinbo, San Jose; Patricia M. Liu, Saratoga; Huyen T. Tran, Sunnyvale, all of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/172,582

(22) Filed: Oct. 14, 1998

(51) Int. Cl.[7] ........................... H01L 21/31; H01L 21/469
(52) U.S. Cl. ............................................. 438/785; 438/790
(58) Field of Search ..................................... 438/785, 790

(56) References Cited

U.S. PATENT DOCUMENTS

| 5,438,012 | * | 8/1995 | Kamiyama . |
| 5,510,651 | | 4/1996 | Maniar et al. . |
| 5,677,015 | * | 10/1997 | Hasegawa . |
| 6,017,789 | * | 1/2000 | Sandhu et al. . |

FOREIGN PATENT DOCUMENTS

| 0860868A2 | 2/1998 | (EP) . |
| 62252961 | 11/1985 | (JP) . |
| 05347229 | 6/1992 | (JP) . |
| 07169917 | 12/1993 | (JP) . |
| 7-169917 | 4/1995 | (JP) . |

OTHER PUBLICATIONS

"Preparation and Ferroelectric Properties of SrBi2Ta2O9 Thin Films", Kazushi Amanuma, Takashi Hase, and Yoichi Miyasaka Appl. Phys. Jan. 9, 1995 Amer. Institute of Phys.
Nitrogen Annealing for Low Temperature Ta2O5 Films G.B. Alers, R.M. Fleming, Y.H. Wong, B. Dennis, and A. Pinczuk 1998 Amer. Institute of Physics pp. 1308–1310.
A Novel Approach for Leakage Current Reduction of LPCVD Ta2O5 and TiO2 Films by Rapid Thermal N2O Annealing S.C. Sun and T.F. Chen 1994 IEEE.
Copy of PCT International Search Report for PCT/US/99/24101.

* cited by examiner

Primary Examiner—John F. Niebling
Assistant Examiner—Josetta Jones
(74) Attorney, Agent, or Firm—Blakely Sokoloff Taylor & Zafman

(57) ABSTRACT

A method of forming a metal oxide dielectric film. According to the present invention an amorphous metal oxide dielectric film is deposited over a substrate utilizing a metal organic precursor. The substrate is then heated in an inert ambient to convert the amorphous metal oxide dielectric to a polycrystalline metal oxide dielectric. The polycrystalline metal dielectric is then heated in a oxygen containing ambients.

16 Claims, 7 Drawing Sheets

POST DEPOSITION TREATMENT OF DIELECTRIC FILMS FOR INTERFACE CONTROL

BACKGROUND OF THE INVENTION

1. Field of the Invention

The present invention relates to the field of semiconductor manufacturing and more specifically to a method and apparatus for treating a deposited metal oxide dielectric film for interface control.

2. Discussion of Related Art

Integrated circuits are made up of literally millions of active and passive devices such as transistors, capacitors and resistors. In order to provide more computational power and/or more storage capability in an integrated circuit, device features are reduced or scaled down in order to provide higher packing density of devices. An important feature to enable scaling of devices is the ability to form high quality, high dielectric constant films for capacitor and gate dielectrics.

High dielectric constant films are generally ceramic films (i.e., metal-oxides) such as tantalum pentaoxide, titanium oxide, BST, and PZT. These films are generally deposited in the amorphous state by thermal chemical vapor deposition utilizing a metal organic precursor. Unfortunately, the use of metal organic precursors tend to incorporate carbon into the deposited oxide. Excess carbon is thought to lead to high leakage currents in metal oxide dielectrics. Traditionally a high temperature oxygen anneal is used to convert the metal oxide dielectric from the amorphous state to the polycrystalline state and to fill oxygen vacancies in the dielectric. Unfortunately, converting the amorphous metal dielectric to a polycrystalline dielectric in a high temperature oxygen anneal traps excess carbon in the dielectric film. Additionally, in the case of capacitors and MOS transistors, the high dielectric metal oxide film is normally formed on a silicon surface or a nitrided silicon surface, and the high temperature oxygen anneal can cause oxygen to diffuse through the dielectric and form undesired silicon dioxide at the metal oxide/silicon nitride and/or at the silicon nitride/poly interfaces. It is to be appreciated that silicon dioxide formation at these interfaces will create a low dielectric constant film in series with the high dielectric metal oxide film and therefore reduce the effective capacitance of the film.

Thus, what is desired is a method for converting an amorphous metal oxide dielectric into a polycrystalline metal oxide dielectric and for filling oxygen vacancies therein and to remove excess carbon without the formation of undesired silicon dioxide layers.

SUMMARY OF THE INVENTION

A method and apparatus for post treatment of metal oxide dielectric films is described. In one embodiment of the present invention an amorphous metal-oxide dielectric is deposited over a substrate utilizing a metal organic precursor. The substrate is then heated in an inert ambient to a temperature greater than the crystallization temperature of the metal oxide dielectric to convert the amorphous metal oxide dielectric to a polycrystalline metal oxide dielectric. The polycrystalline metal oxide dielectric is then heated to a temperature greater than the crystallization temperature in an oxygen ambient to fill oxygen vacancies therein.

In another embodiment of the present invention an amorphous metal oxide dielectric is deposited over a substrate utilizing a metal organic precursor. The substrate is then heated to a temperature less than the crystallization temperature of the metal oxide dielectric while exposing the substrate to an ambient comprising oxygen or to an oxidizing environment. The substrate is then heated to a temperature greater than the crystallization temperature in an inert ambient in order to convert the amorphous metal oxide dielectric to a polycrystalline metal oxide dielectric.

In still yet another embodiment of the present invention a metal oxide dielectric film is deposited over a substrate utilizing a metal organic precursor. The substrate is then annealed a first time at a first temperature which is less than the crystallization temperature of said metal oxide dielectric. The substrate is then annealed a second time in an inert ambient at a second temperature which is greater than the crystallization temperature of the metal oxide dielectric. The substrate is then annealed a third time in a oxygen ambient at a third temperature which is greater than the crystallization temperature of the metal oxide dielectric.

BRIEF DESCRIPTION OF THE DRAWINGS

FIG. 3b is an illustration of the cross-sectional view showing the formation of an amorphous metal oxide dielectric film on the substrate of FIG. 3a.

FIG. 4b is an illustration of the cross-sectional view showing a metal oxide dielectric film after the post deposition treatment of the present invention on the substrate of FIG. 4a.

DETAILED DESCRIPTION OF THE PRESENT INVENTION

Figure 1:
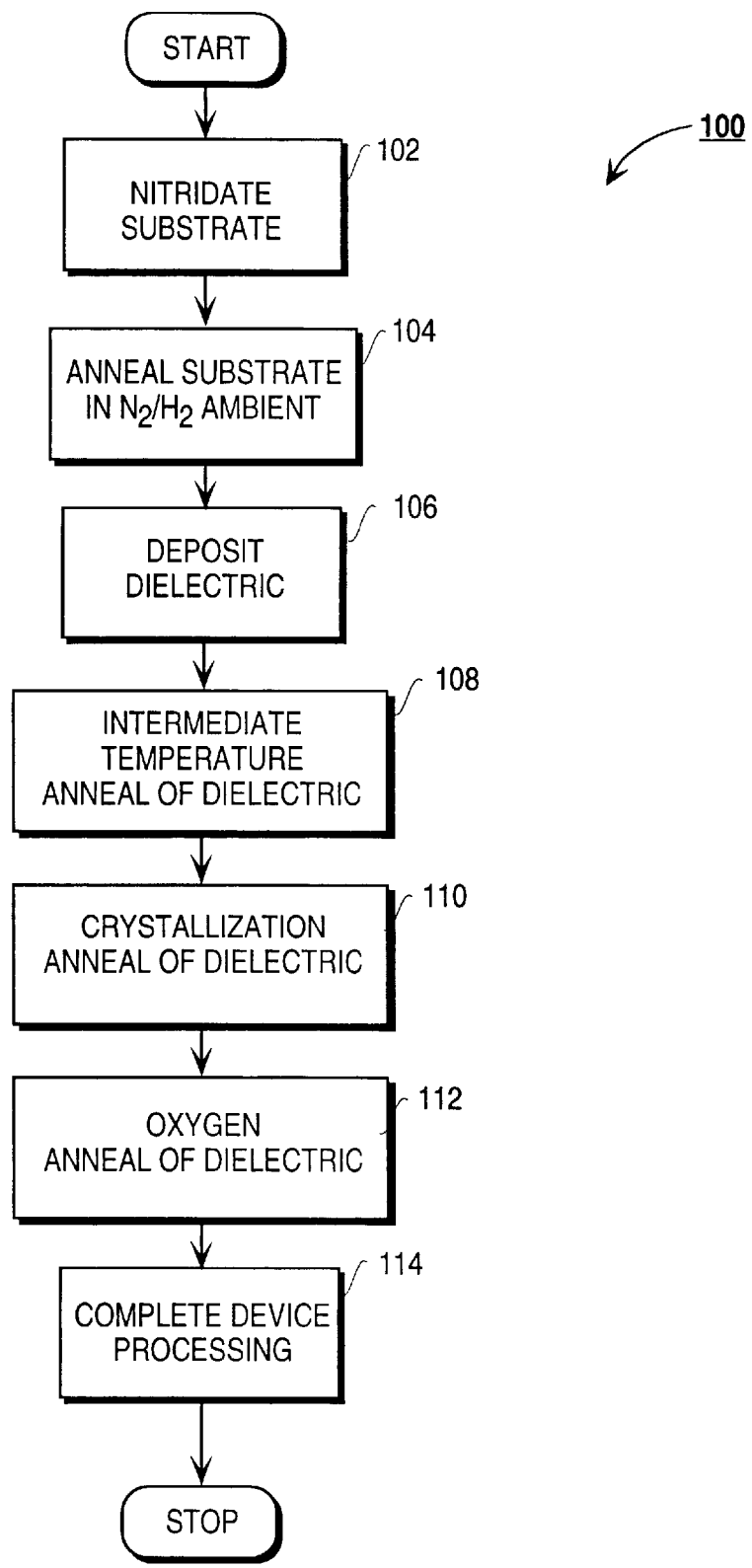
FIG. 1 is a flow chart which illustrates a process of forming a semiconductor device utilizing the post deposition anneal process of the present invention.

The present invention describes a novel method and apparatus for post treatment of a dielectric film for interface control. In the following description numerous specific details such as specific equipment, and process parameters are set forth in order to provide a thorough understanding of the present invention. One skilled in the art will appreciate the ability to use alternative configurations and process details to the disclosed specifics without departing from the scope of the present invention. In other instances, well known semiconductor processing equipment and methodology have not been described in detail in order to not unnecessarily obscure the present invention.

The post deposition treatment of the present invention is a series of anneal steps which together improve the interface characteristics and electrical properties of a deposited metal oxide dielectric film. According to the present invention, a metal oxide dielectric film, such as tantalum oxide or titanium oxide, is deposited by chemical vapor deposition utilizing a metal organic precursor, such as but not limited to TAETO, TATDME, and TIPT. The deposition conditions are controlled to provide an amorphous metal oxide dielectric film. The metal oxide dielectric layer is typically formed on a nitride barrier layer formed on a silicon surface.

The amorphous metal oxide dielectric film is then exposed to a first intermediate temperature anneal. The intermediate temperature anneal occurs at a temperature less than the crystallization temperature of the metal oxide dielectric and can occur in either an inert ambient or in an oxidizing ambient. The intermediate temperature anneal is used primarily to remove or reduce carbon contaminants which are present due to the use of a metal organic precursor during deposition. Because of the intermediate temperature anneal occurs at a temperature less than the crystallization temperature, carbon contaminants can easily react with excess oxygen contained in the film and form $CO_2$ and readily defuse out of the film. Additionally, carbon present in the deposited metal oxide film as $C_xH_y$ and will come out $C_xH_y$ at high temperatures. Excess carbon is thought to lead to high leakage currents in the dielectric film.

After the intermediate temperature anneal, the metal oxide film is exposed to a crystallization anneal. The crystallization anneal occurs at a temperature greater than the crystallization temperature of the metal oxide dielectric and occurs in an inert ambient. The crystallization anneal reduces excess carbon and converts the amorphous film into a crystalline (poly) metal oxide dielectric. The crystallization of the metal oxide dielectric increases the dielectric constant of the film. By utilizing a non oxygen ambient to crystallize the film, silicon oxide is prevented from forming at the metal oxide/silicon nitride or silicon nitride/silicon interface.

Next, the crystallized metal oxide film is annealed with an oxygen anneal which occurs at a temperature greater than the crystallization temperature of the film and utilizes oxygen ambient such as $O_2$ or $N_2O$. The high temperature oxygen anneal fills oxygen vacancies in the metal oxide dielectric and thereby reduces its leakage current. Because the metal oxide dielectric has been previously converted to its crystalline form, oxygen is unable to diffuse completely through the film and cause a formation of undesired silicon dioxide at the silicon nitride/metal oxide interface or at the silicon/silicon nitride interface.

The various anneal processes of the present invention can be combined together or can be used as subsets of one another to form a high quality, high dielectric constant metal oxide dielectric film for use in semiconductor devices.

A method of fabricating a semiconductor device utilizing the dielectric post treatment process of the present invention will be described in reference to FIG. 1, FIGS. 2a–2e and FIGS. 3a–3d. FIG. 1 illustrates a flow chart which depicts a process of fabricating a semiconductor device which utilizes the post deposition treatment of the present invention. FIGS. 2a–2e illustrate a specific embodiment of the present invention where the post deposition treatment anneals of the present invention are used to form a high dielectric constant metal oxide dielectric film for a metal insulator silicon (MIS) capacitor of a DRAM cell. FIGS. 3a–3d illustrate a specific embodiment of the present invention where the post deposition treatment anneals are used to form a high dielectric constant metal oxide dielectric film for a metal insulator metal (MIM) capacitor of a DRAM cell. It is to be appreciated that the specific details are only illustrative of an embodiment of the present invention and are not to be taken as limiting of the present invention.

Figure 2A:
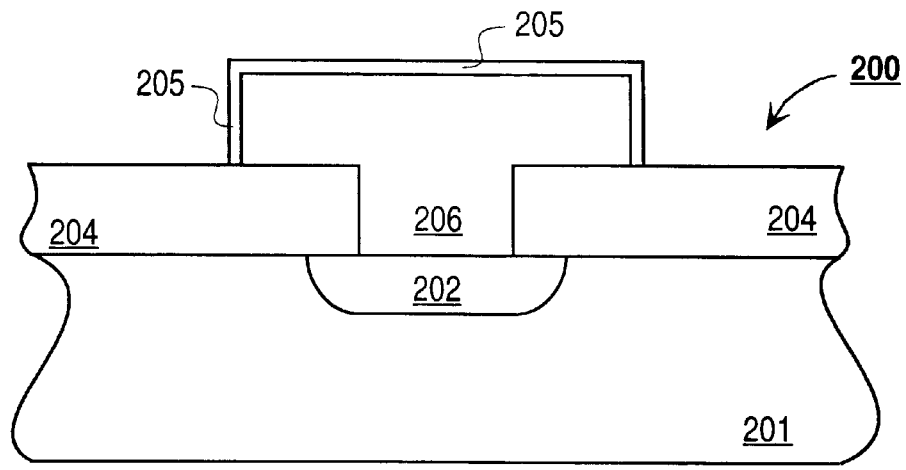
FIG. 2a is an illustration of a cross-section view of a substrate including an interlayer dielectric and a bottom capacitor electrode having a silicon nitride film formed thereon.

In one embodiment of the present invention, the substrate is a substrate used in the fabrication of a dynamic random access memory (DRAM) cells such as substrate 200 shown in FIG. 2a. Substrate 200 includes well known silicon epitaxial substrate 201 having a doped region 202 and a patterned interlayer dielectric 204. A bottom polysilicon capacitor electrode 206 is formed in contact with the diffusion region 202 and over ILD 204. Bottom capacitor electrode 206 can be formed by any well known technique such as by blanket depositing a polysilicon film by chemical vapor deposition (CVD) utilizing a reactive gas comprising silane ($SiH_4$) and $H_2$ and then patterning the blanket deposited material into an electrode with well known photolithography and etching techniques. Bottom electrode 206 will typically be doped to a density between $2–5 \times 10^{20}$ atoms/$cm^3$. Bottom electrode 206 can also be other types of silicon electrodes capacitor electrodes such as but not limited to hemispherical grained polysilicon (HSG) or "rough poly" electrodes. In still other cases, as is well known in the art, monocrystalline silicon substrate 201 can act as the bottom electrode 206.

The first step, as set forth in block 102 of flow chart 100, is to nitridate substrate 200 to form a thin silicon nitride barrier layer 205 on bottom electrode 206 as shown in FIG. 2a. The purpose of silicon nitride barrier layer 205 is to form an oxidation prevention barrier layer for bottom electrode 206. In this way oxygen cannot penetrate grain boundaries of polysilicon electrode 206 and form oxides therein which can lead to a decrease in the effective dielectric constant of the capacitor dielectric and to an increase in electrode resistance. Because defects, such as pinholes, formed in silicon nitride film 205, are to be subsequently cured by the forming gas anneal of the present invention, a thin, between 10–25Å, barrier layer can be reliably used. Utilizing a thin silicon nitride layer improves throughput and also reduces the negative capacitive impact the silicon nitride layer will have on a capacitor formed with a high dielectric constant such as tantalum pentaoxide ($Ta_2O_5$). Although a silicon nitride film is preferred in the manufacture of a MIS capacitor it is not necessary to practice the post deposition anneals of the present invention.

A thin silicon nitride film 205 can be formed by any well known method. For example, silicon nitride film 205 can be formed by thermal nitridation by placing substrate 200 into a low pressure chemical vapor deposition (LPCVD) furnace and heating substrate 200 to a temperature between 800°–950° C. and exposing substrate 200 to ammonia gas ($NH_3$). Ammonia (NH3) gas then reacts with exposed silicon surfaces such as polysilicon electrode 206 to form a silicon nitride ($Si_3N_4$) film 205. Alternatively, silicon nitride film 205 can be formed by exposing substrate 200 to highly reactive nitrogen atoms formed by disassociating $NH_3$ or $N_2$ gas with microwaves in a cavity or chamber which is remote from the chamber in which substrate 200 is located. It is to be appreciated, that because the quality of silicon nitride film 205 is to be subsequently improved with a forming gas anneal, relatively low, less than 950° C., nitridation temperatures maybe utilized to form silicon nitride film 205. Low nitridation temperatures are desirable because they reduce the thermal budget of the manufacturing process which is becoming increasingly important in the manufacture of modern high density integrated circuits such as microprocessors and high density dynamic random access memories.

Figure 2B:
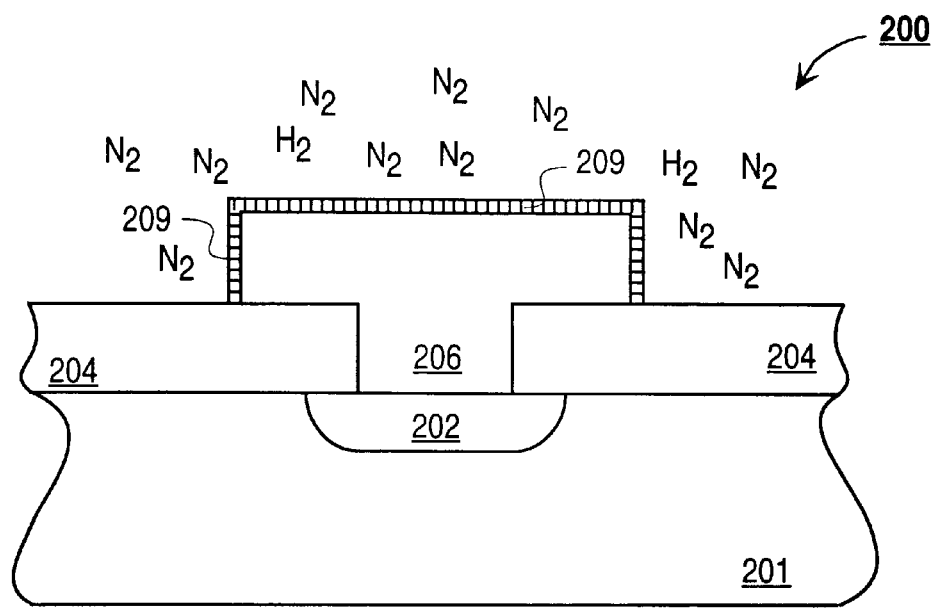
FIG. 2b is an illustration of a cross-sectional view showing the annealing of the substrate of FIG. 2a with an $H_2/N_2$ ambient.

Next, as set forth in block 104 a flow chart 100, substrate 200 is annealed in a forming gas ($N_2/H_2$) ambient to form a high quality annealed silicon nitride layer 209 as shown in FIG. 2b. Substrate 200 can be annealed in accordance with the present invention by placing substrate 200 into a chamber of a rapid thermal processor (RTP) such as a Applied Materials RTP Centura with Honeycomb source and heated to a temperature between 700°–850° C. and flowing hydrogen gas ($H_2$) and nitrogen gas ($N_2$) into the chamber to create an ambient which consist of 90–99% $N_2$ and 1–10% H2 by volume. Annealing substrate 200 in a RTP chamber for between 60–180 seconds suitably improves the integrity of the thin silicon nitride barrier layer 205 and improves the interface between barrier layer 205 and polysilicon electrode 206. In one embodiment of the present invention a forming gas ambient is created by flowing 1.0 slm of nitrogen gas ($N_2$) gas and 100 sccm of hydrogen gas ($H_2$) into the chamber of the processor. Although a rapid thermal processor is preferably used to carryout the forming gas anneal, the other well known apparatuses such as furnaces maybe used to anneal substrate 200, if desired. In the case of a furnace anneal, substrate 200 can be annealed with a forming gas ($N_2/H_2$) ambient at a temperature between 700°–850° C. for approximately 30 minutes.

By heating and exposing substrate 200 to hydrogen gas and nitrogen gas, defects such as pinholes in silicon nitride film 205 are eliminated or substantially reduced. In this way oxygen cannot penetrate through silicon nitride barrier layer 209 and oxidize silicon electrode 206. Additionally, annealing substrate 200 with forming gas provides hydrogen which can defuse through silicon nitride layer 205 and cure defects, such as dangling bonds, at the silicon nitride 205/polysilicon electrode 206 interface which could otherwise trap charges and cause poor device performance such as high leakage currents. Thus, the forming gas anneal of the present invention enables the formation of a thin robust silicon nitride barrier layer 209 and enables the formation of a high quality interface between silicon nitride barrier layer 209 and polysilicon electrode 206.

Although the present invention preferably anneals substrate 200 in a forming gas ($H_2/N_2$) ambient other hydrogen ($H_2$) containing ambients may be utilized. For example substrate 200 can be annealed as described above utilizing ambient comprising hydrogen ($H_2$) and argon (Ar) or to an ambient comprising hydrogen ($H_2$) and helium (He). Additionally, it is also possible to anneal substrate 200 in an ambient consisting of 100% $H_2$ and obtain benefits as described above.

Figure 2C:
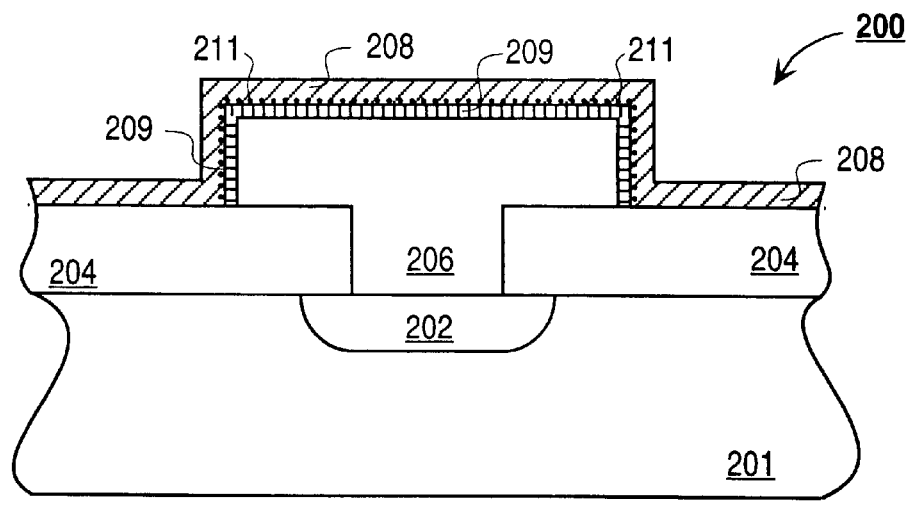
FIG. 2c is an illustration of a cross-sectional view showing the formation of an amorphous metal oxide dielectric film on the substrate of FIG. 2b.
Figure 2D:
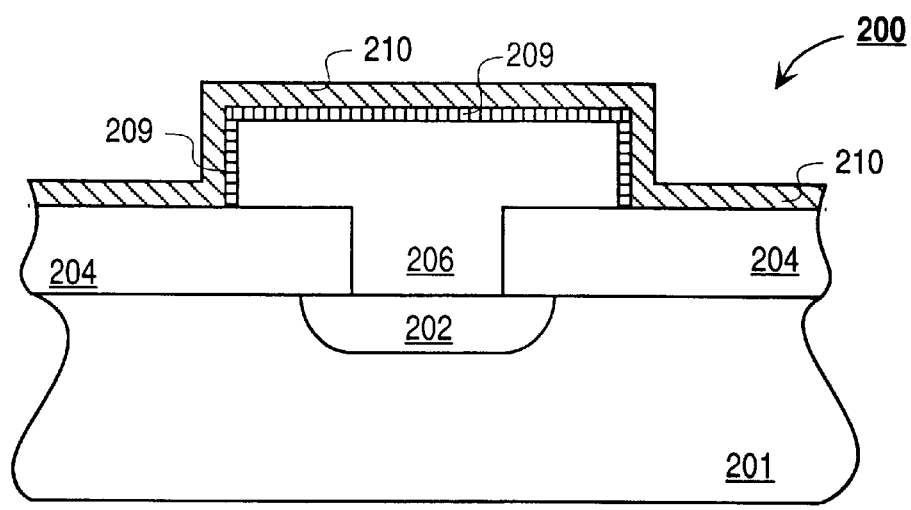
FIG. 2d is an illustration of a cross-sectional view showing a metal-oxide dielectric film after the post deposition treatment of the present invention on the substrate of FIG. 2c.

Next, as set forth in block 106, an amorphous metal oxide dielectric film is formed over substrate 200. In one embodiment of the present invention the amorphous metal oxide dielectric film 208 is blanket deposited over ILD 204 and annealed silicon nitride film 209 formed on bottom electrode 206 of substrate 200 as shown in FIG. 2c. In a preferred embodiment of the present invention the dielectric film is a transition metal-oxide dielectric film such as, but not limited to, tantalum oxide and titanium oxide. In another embodiment dielectric layer 208 is a tantalum pentaoxide film doped with titanium. Additionally dielectric layer 208 can be a composite dielectric film comprising a stack of different dielectric films such as a $Ta_2O_5/TiO_2/Ta_2O_5$ stacked dielectric film. Additionally, dielectric layer 208 can be a piezoelectric dielectric such as Barium Strontium Titanate (BST) and Lead Zerconium Titanate (PZT) or a ferroelectric.

In order to form a dielectric layer 208 onto substrate 200, the substrate can be placed into a thermal process chamber such as the chamber of an Applied Materials CVD single wafer reactor. The substrate is then heated to a desired deposition temperature while the pressure within the chamber is pumped down (reduced) to a desired deposition pressure. Deposition gases are then fed into the chamber and a dielectric layer formed therefrom.

In a preferred embodiment of the present invention dielectric 208 is deposited as an amorphous or substantially amorphous tantalum oxide film. To blanket deposit a amorphous tantalum oxide dielectric film by thermal chemical vapor deposition a deposition gas mix comprising, a source of tantalum, such as but not limited to, TAETO [Ta $(OC_2H_5)_5$] and TAT-DMAE [Ta $(OC_2H_5)_4$ $(OCHCH_2 N(CH_3)_2)$], and source of oxygen such as $O_2$ or $N_2O$ can be fed into a deposition chamber while the substrate is heated to a deposition temperature of between 300°–500° C. and the chamber maintained at a deposition pressure of between 0.5–10 torr. The flow of deposition gas over the heated substrate results in thermal decomposition of the metal organic Ta-containing precursor an subsequent deposition of a tantalum pentaoxide film. In one embodiment TAETO or TAT-DMAE is fed into the chamber at a rate of between 10–50 milligrams per minute while $O_2$ or $N_2O$ is fed into the chamber at a rate of 0.3–1.0 SLM. TAETO and TAT-DMAE can be provided by direct liquid injection or vaporized with a bubbler prior to entering the deposition chamber. A carrier gas, such as $N_2$, Ar or He, at a rate of between 0.5–2.0 SLM can be used to transport the vaporized TAETO or TAT-DMAE liquid into the deposition chamber. Deposition is continued until a dielectric film 208 of a desired thickness is formed. A amorphous tantalum oxide dielectric film having a thickness between 50–200 Å provides a suitable capacitor dielectric.

Because high dielectric constant metal oxide dielectrics formed by chemical vapor deposition utilize a metal organic precursor, such as TAT-DMAE, TAETO, and TIPT, carbon 211 in the form of atomic carbon (C) and carbon-hydrogen molecules are incorporated into the deposited film. The carbon tends to be largely incorporated at the metal oxide 208/silicon nitride 209 interface as shown in FIG. 2c. Excessive carbon in the metal oxide dielectric is thought to lead to high leakage currents. In order to improve the performance of semiconductor devices utilizing metal oxide dielectrics deposited from metal organic precursors the carbon must be removed from the interface.

In order to improve the quality of the as deposited amorphous metal dielectric the substrate is exposed to a series of anneal steps. The first anneal step, as set forth in block 108 of flow chart 100, is an intermediate temperature anneal. An intermediate temperature anneal is an anneal which occurs at a temperature less than the crystallization temperature of the amorphous metal oxide dielectric. In the case of tantalum oxide the crystallization temperature is between 700° C.–750° C. (It is to be appreciated that the crystallization temperature is generally a bulk film characteristic. In the case of thin films, 50–200Å, such as typically used in semiconductor devices, the crystallization temperature can vary depending upon film thickness, stress, and deposition parameters. According to the present invention the crystallization temperature is a temperature at which an amorphous or substantially amorphous metal oxide dielectric is converted to a polycrystalline film.)

The intermediate temperature anneal step can occur in either an inert ambient or in a ambient comprising oxygen. For the purposes of the present invention an inert ambient is an ambient which under the given anneal conditions will not chemically react with the metal oxide dielectric or underlying layers such as polysilicon electrode 206 and silicon nitride layer 209. For the purpose of the present invention an inert ambient includes $N_2$ and gases from the last column of the periodic table (e.g Argon (Ar), Helium (He), Xeon (Xe), etc.) and combinations thereof. An inert ambient will not include oxygen atoms or molecules containing oxygen and will not include hydrogen. In the fabrication of a MIS capacitor the intermediate temperature anneal can occur in an inert ambient or in an ambient containing oxygen. In the fabrication of other devices, such as a MIM capacitor, where a high temperature oxygen anneal cannot be used, it is desirable to utilize an ambient containing oxygen generated from an oxygen source such as oxygen ($O_2$) or $N_2O$.

In an embodiment of the present invention an amorphous tantalum pentalum oxide dielectric film is intermediate temperature annealed by heating substrate 200 to a temperature between 400°–650° C. Any well known technique can be used to intermediate temperature anneal amorphous metal oxide dielectric film 208. In one embodiment of the present invention a tantalum oxide dielectric is intermediate temperature annealed in a rapid thermal processor (RTP) for between 60–180 seconds at a pressure between atmospheric and 100 torr at a temperature between 400°–650° C. in an inert ambient, such as $N_2$, or in an oxidizing ambient such as $N_2O$ or $O_2$. In another embodiment of the present invention the intermediate temperature anneal occurs in a furnace for between 30–60 minutes. And still in another embodiment of the present invention amorphous metal oxide dielectric 208 can be intermediate annealed for between 60–180 seconds with highly reactive nitrogen atoms and/or oxygen atoms (i.e. activated nitrogen and/or oxygen) formed by disassociating $N_2$, $O_2$ or $N_2O$ gas or combinations thereof with microwaves in a chamber which is remote from the chamber from which substrate 200 is annealed. In still yet another embodiment of the present invention, the amorphous metal oxide dielectric 208 can be annealed with a direct plasma (i.e. where highly activated atoms are formed in the same chamber in which the substrate is annealed). Still further the metal oxide dielectric can be annealed using a UV source and Ozone ($O_3$).

Although the intermediate temperature anneal of the present invention is not required it is desirable process step because it "burns off" or removes carbon from the metal oxide/silicon nitride interface. During the intermediate temperature anneal, carbon at the interface reacts with excess of oxygen in the film to form $CO_2$. Because the intermediate temperature anneal is at a temperature less than the crystallization temperature, the film remains amorphous during the anneal enabling oxygen to diffuse to the interface react with carbon to form $CO_2$ and then diffuse out of the film.

After the intermediate temperature anneal, the next step of the post deposition treatment of the present invention, as set forth in block 110 of flow chart 100, is to subject the amorphous metal oxide dielectric layer to a crystallization anneal. The crystallization anneal is anneal which occurs at a temperature greater than the crystallization temperature of the metal oxide dielectric and which occurs in an inert ambient. The crystallization anneal converts the amorphous metal oxide dielectric into a polycrystalline metal oxide dielectric. Because the crystallization anneal occurs in an inert ambient, the crystallization anneal forces carbon and oxygen already present in the metal oxide dielectric to react and form $CO_2$ and outgassed carbon (C) in the form $C_xH_y$. The result is an efficient method for reducing the carbon that causes leakage current and excess oxygen at the metal oxide silicon nitride interface that leads to a non ideal interface layer. Because the crystallization anneal is such an efficient method of removing excess carbon and oxygen, one can do without the intermediate temperature anneal and still obtain a sufficiently high quality high dielectric constant metal oxide dielectric film with low leakage current. Additionally, the conversion of the amorphous metal oxide dielectric to a polycrystalline metal dielectric increases the dielectric constant of the film. Additionally, crystallizing the metal oxide film forms grains which impede oxygen from diffusing through the crystalline metal oxide dielectric during a subsequent oxygen anneal and thereby prevents the formation of undesired silicon oxide layers. Any well known anneal process technology including RTP, furnace, direct plasma, and remote plasma may be used to carry out the crystallization anneal of the present invention.

An amorphous tantalum pentaoxide film can be given a crystallization anneal by heating substrate 200 to a temperature between 750°–850° C. in an inert ambient such as but not limited to $N_2$, Argon or Helium. A tantalum oxide film can be sufficiently crystallized by exposing to an inert ambient at a temperature of 750°–850° C. at a pressure between 100 torr and atmospheric for between 60–180 seconds in a rapid thermal processor (RTP). Such a crystallization anneal will convert an amorphous tantalum-oxide film into a polycrystalline tantalum pentaoxide ($Ta_2O_5$) dielectric. The anneal time and temperature of the crystallization anneal should be chosen so as not to form grains which are too large. Large grains will enable oxygen atoms to diffuse, during the subsequent oxygen anneal, through the boundaries between the large grains and reach the metal oxide/silicon nitride interface and form undesired silicon oxide.

After the crystallization of the metal oxide dielectric, the next step as set forth in block 112 of flow chart 100 for post deposition treatment of the metal oxide dielectric film is to expose the crystallized metal oxide dielectric to a high temperature oxygen anneal. The high temperature oxygen anneal occurs at a substrate temperature which is greater than the crystallization temperature of the metal oxide dielectric and occurs in an ambient comprising oxygen, such as but not limited to an ambient comprising 100% $O_2$, an ambient comprising $O_2$ and $N_2$, an ambient comprising $N_2O$ or combinations thereof. The purpose of the high temperature oxygen anneal is to anneal oxygen into the crystallized metal oxide dielectric and thereby fill oxygen vacancies. Oxygen vacancies are thought to lead to high leakage currents in metal oxide dielectrics. Because the high temperature oxygen anneal occurs after the metal dielectric has been crystallized, oxygen atoms have a difficult time diffusing completely through the various grain boundaries of the crystallized dielectric and reach, the metal oxide/silicon nitride interface and the silicon nitride/silicon interface where they can form undesired $SiO_2$.

Any well known anneal technique such as but not limited to a rapid thermal anneal (RTA), a furnace anneal, a plasma anneal, a remote plasma, or a UV excited ($O_3$) ozone anneal may be used for the high temperature oxygen anneal of the present invention. After the oxygen anneal, a stable high quality, high dielectric constant polycrystalline metal oxide dielectric 210 with reduced carbon contamination and oxygen vacancies is formed. A crystalline tantalum pentaoxide dielectric film can be sufficiently oxygen annealed in accordance with the present invention by placing substrate 200 into a rapid thermal processor, heating the substrate to a temperature between 750°–850° C. in an $O_2$ or $N_2O$ ambient at a pressure between 200–740 torr for between 30–60 seconds.

Figure 2E:
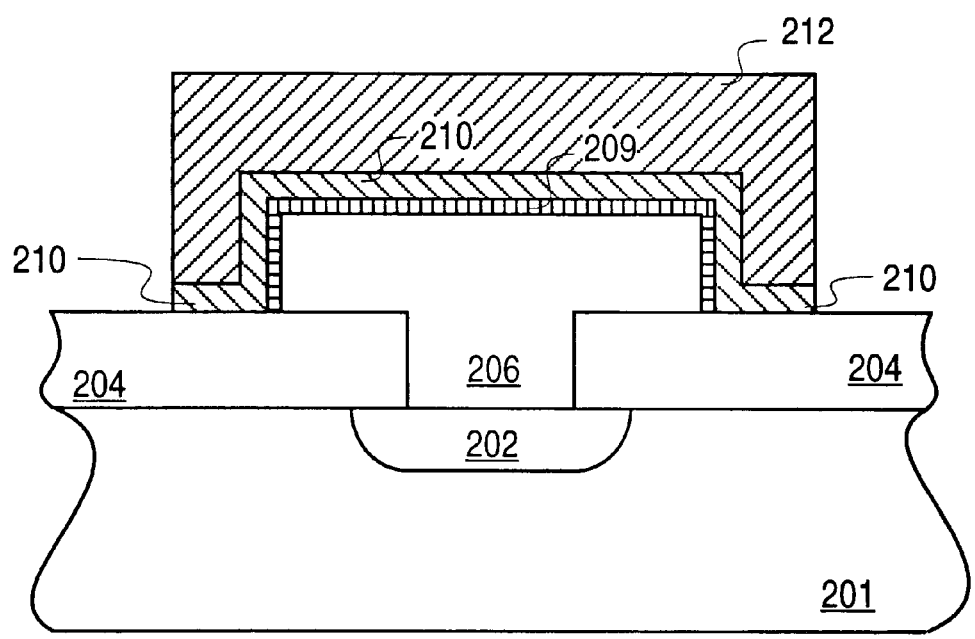
FIG. 2e is an illustration of a cross-sectional view showing the formation of a top capacitor electrode on the substrate of FIG. 2d.

The next step of the present invention, as set forth in block 114 of flow chart 100 is to complete the processing of the device. For example, as shown in FIG. 2e, a top capacitor electrode 212 can be formed over annealed dielectric layer 210. Any well known technology can be used to form top electrode 212, top electrode can be a formed by depositing a metal film, such as titanium nitride (TiN), or tungsten nitride (WN) over annealed dielectric film 210 and then using well known photolithography and etching techniques to pattern the electrode film and dielectric layer. As is well known in the art, if desired the top electrode 212 can include a polysilicon film formed on top of the TiN or WN metalization.

Although the three anneal steps of the post deposition treatment of the present invention are ideally suited for use in serial combination with one another, at times due to throughput requirements, film quality requirements, and process compatibility all that may be necessary or compatible are two of the post deposition anneal steps. For example, in the case of a metal-insulator-metal (MIN) capacitor cell, it is generally undesirable to expose the bottom metal electrode, typically TiN or tungsten nitride (WN), to a high temperature oxygen anneal. High temperature oxygen anneals of metal oxides on metal electrodes can lead to undesired reaction between the metal-electrode and metal oxide dielectric resulting in undesired oxidation of the electrode. Because the bottom electrode is incompatible with the high temperature oxygen anneal necessary to fill oxygen vacancies, the ambient used during the intermediate temperature anneal can include a source of oxygen, such as $O_2$ or $N_2O$, to fill vacancies.

Figure 3A:
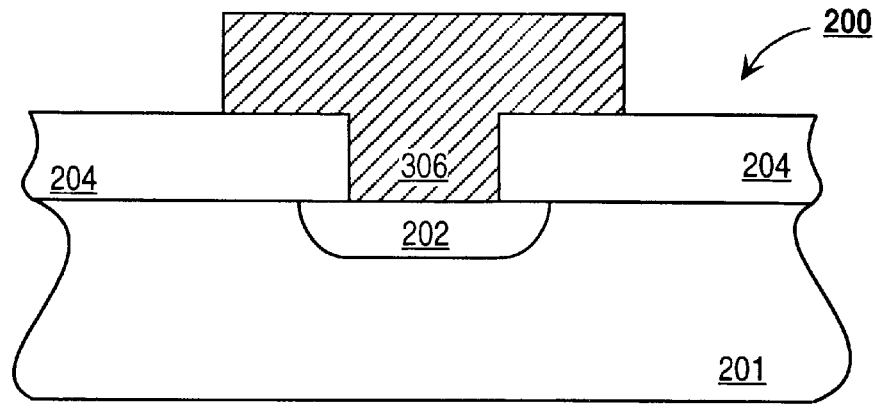
FIG. 3a is an illustration of the cross-sectional view of a substrate including the interlayer dielectric and a bottom metal capacitor electrode.
Figure 3B:
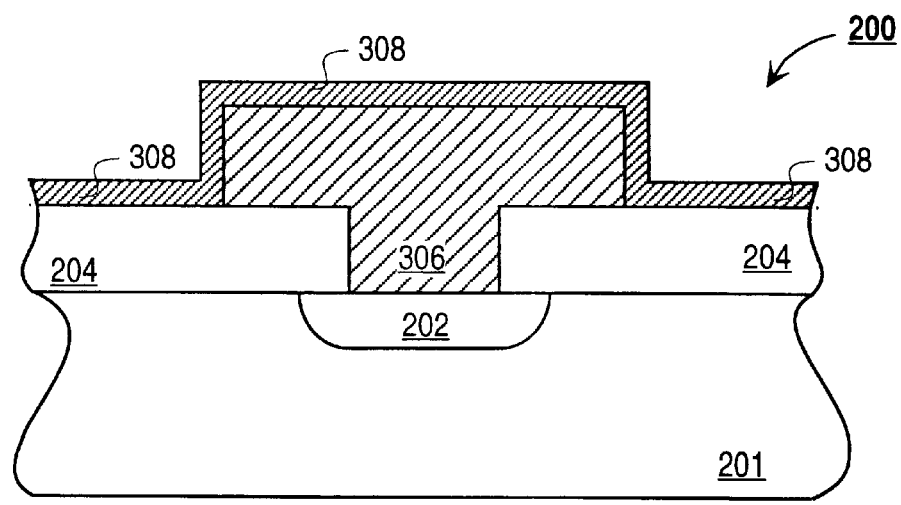
Figure 3C:
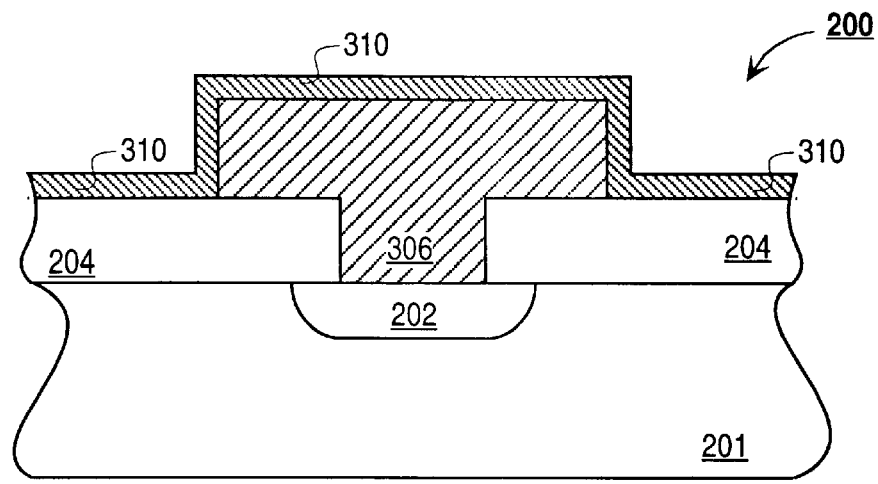
FIG. 3c is an illustration of the cross-sectional view showing a metal oxide dielectric film after the post deposition treatment of the present invention.

For example, in the fabrication of an MIM capacitor, as illustrated in FIGS. 3a–3d a metal electrode 306, such as titanium nitride (TiN) or tungsten nitride (WN) is formed in place of polysilicon electrode 206 as shown in FIG. 3a. A metal electrode 306 can be formed by any well know technique such as by sputtering a blanket metal layer of tungsten nitride or titanium nitride and then patterning the film into an electrode. An amorphous metal oxide dielectric 308 is then blanket deposited over and onto ILD 204 and metal electrode 306 utilizing a metal organic precursor as discussed above and shown in FIG. 3b. The amorphous metal oxide dielectric is then exposed to an intermediate temperature anneal utilizing an oxygen containing ambient. Because the intermediate temperature anneal occurs at a reduced temperature (i.e. at a temperature less than the crystallization temperature of the metal oxide film) there is not sufficient thermal energy to decompose the source of oxygen, such as $N_2O$ or $O_2$, into oxygen atoms to fill the vacancies in the metal oxide dielectric. As such, if the intermediate anneal is be used to fill vacancies or as a substitute for the high temperature oxygen anneal, some external energy source must be applied to form activated oxygen atoms.

For example, amorphous metal oxide dielectric 308 can be intermediate temperature annealed with activated oxygen atoms formed by disassociating $O_2$ or $N_2O$ gas with microwaves in a chamber remote from the chamber in which the substrate is annealed. In this way the substrate can be annealed at a temperate less than the crystallization temperature of the metal oxide dielectric but still be exposed to highly energized or activated oxygen atoms. Alternatively, the intermediate temperature anneal can be carried out by heating the substrate to a temperature less the crystallization temperature of the metal oxide dielectric and exposing the substrate to highly activated oxygen atoms formed by disassociating $O_2$ or $N_2O$ with microwaves in the same chamber in which the substrate is annealed (i.e. direct plasma anneal). Still further the amorphous metal oxide dielectric can be intermediate temperature annealed in an ambient created by disassociating ozone ($O_3$) which UV excitation. In each case, the substrate can be heated to a temperature less than the crystallization temperature but yet still be exposed to highly activated oxygen atoms.

An amorphous tantalum oxide dielectric can be sufficiently intermediate temperature annealed by heating substrate 200 for between 30–120 seconds to a temperature between 300°–650° C. at a pressure of about 2 torr while exposing the substrate to activated oxygen atoms formed by disassociating a flow of 2 slm of $O_2$ and 1 slm of $N_2$ with microwaves utilizing a power between 500–1500 watts in a chamber remote from the chamber in which substrate 200 is annealed.

Figure 3D:
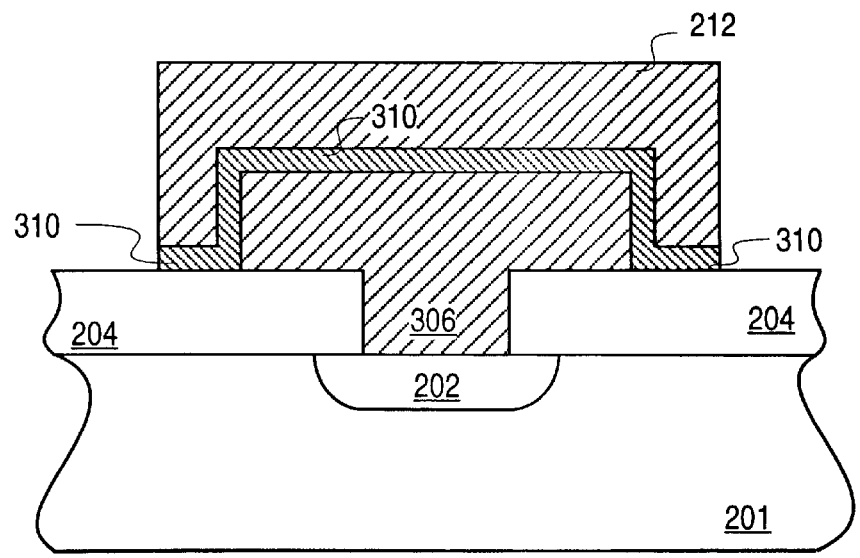
FIG. 3d is an illustration of the cross-sectional view showing the formation of a top capacitor electrode on a substrate of FIG. 3c.
Figure 4A:
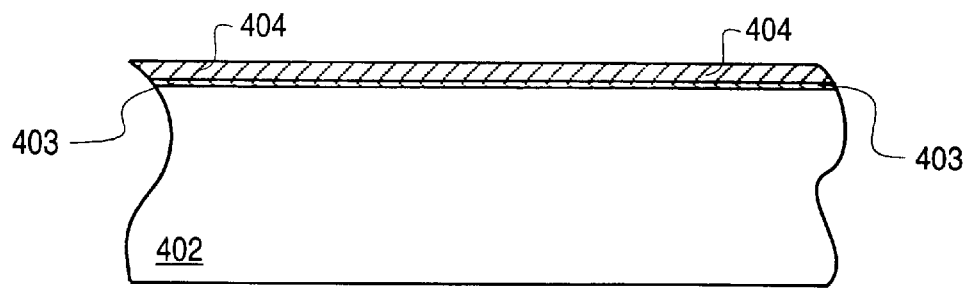
FIG. 4a is an illustration of the cross-sectional view showing the formation of an amorphous metal oxide dielectric on a substrate.
Figure 4B:
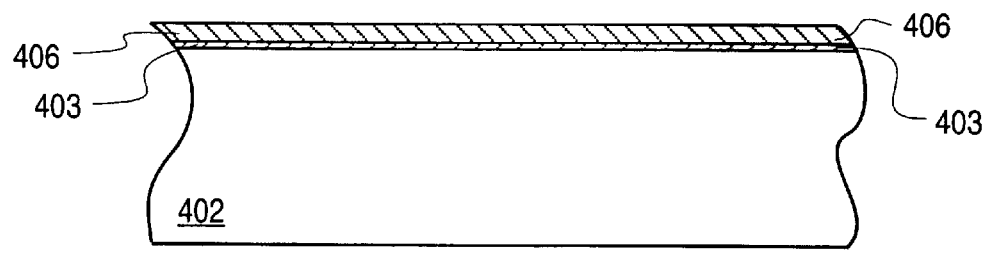
Figure 4C:
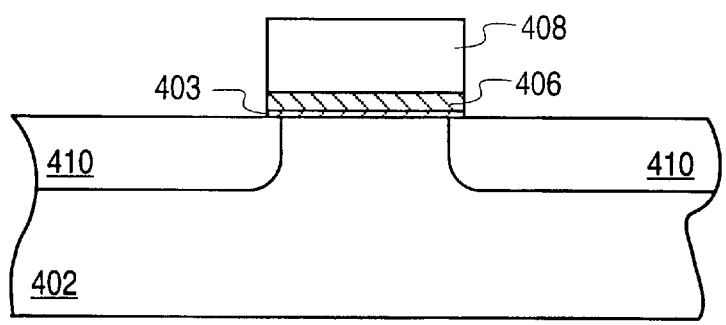
FIG. 4c is an illustration of the cross-sectional view showing the formation of a top gate electrode on the substrate of FIG. 4b.

After the intermediate temperature anneal utilizing oxygen atoms, the metal oxide dielectric formed on the metal capacitor electrode can be subjected to a crystallization anneal in an inert ambient to convert the amorphous metal oxide film to a polycrystalline metal oxide film as discussed above. In such a case a stable metal oxide dielectric film 310 can be formed without the use of a high temperature oxygen anneal. Next, as shown in FIG. 3d a top gate electrode 212 is formed over the crystallized metal oxide dielectric 310 as shown in FIG. 3d and as discussed above.

Additionally, although the post deposition treatment of a metal oxide dielectric of the present invention has been described with respect to the specific embodiments of forming capacitor electrodes, one with ordinary skill in the art will appreciate the ability to utilize the process of the present invention in the manufacture of other semiconductor devices. For example the post deposition treatment of a metal oxide dielectric is equally useful in the formation of a high dielectric constant metal oxide gate dielectric for a metal oxide semiconductor (MOS) transistor. In such a case an amorphous metal oxide dielectric film 404 would be deposited over a silicon 402 or nitrided silicon substrate 403. The metal oxide dielectric would then be exposed to the post deposition treatment of the present invention to form a stable crystalline metal oxide dielectric 406 with reduced carbon contaminants and oxygen vacancies. A gate electrode 408 would then be deposited and patterned over the metal oxide dielectric and source/drain regions 410 formed on opposite sides of the gate electrode as is well known in the art.

Thus, a method of forming a stable high quality, high dielectric constant metal oxide dielectric with reduced carbon contamination and oxygen vacancies has been described.

We claim:

1. A method of forming a metal oxide dielectric film comprising:

depositing an amorphous metal oxide dielectric utilizing a metal organic precursor over a substrate;

heating said substrate in an inert ambient to convert said amorphous metal oxide dielectric to a polycrystalline metal oxide dielectric; and heating said polycrystalline metal oxide dielectric in an oxygen containing ambient.

2. A method of forming a metal oxide dielectric comprising:
depositing an amorphous metal oxide dielectric utilizing a metal organic precursor over a substrate;
heating said substrate to a temperature less than the crystallization temperature of said metal oxide dielectric while exposing said substrate to an ambient comprising oxygen; and
heating said substrate to a temperature greater than the crystallization temperature in an inert ambient to convert said amorphous metal oxide dielectric to a polycrystalline metal oxide dielectric.

3. A method of forming a metal oxide dielectric comprising:
depositing a metal oxide dielectric utilizing a metal organic precursor over a substrate;
heating said substrate to a first temperature which is less than the crystallization temperature of said metal oxide dielectric to remove carbon from said metal oxide dielectric;
heating said substrate in an inert ambient to a second temperature which is greater than said crystallization temperature to convert said amorphous metal oxide dielectric film to a crystalline metal oxide dielectric film; and
heating said substrate in an ambient comprising oxygen to a temperature greater than the crystallization temperature of said metal oxide dielectric.

4. The method of claim 3 wherein said step of heating said substrate to a first temperature occurs in an inert ambient.

5. A method for forming a metal oxide dielectric comprising:
depositing a metal oxide dielectric utilizing a metal organic precursor onto a substrate;
annealing said substrate a first time, wherein said first anneal occurs at a first temperature and in a first ambient for a first period of time, wherein said first temperature is less than the crystallization temperature of said metal oxide dielectric;
annealing said substrate a second time wherein said second anneal occurs at a second temperature which is greater than the crystallization temperature of said metal oxide dielectric wherein said second anneal occurs in an inert ambient; and
annealing said substrate a third time wherein said third anneal occurs at a third temperature which is greater than the crystallization temperature of said metal oxide dielectric and occurs in a third ambient which contains oxygen.

6. The method of claim 5 wherein said second ambient is selected from the group consisting of $N_2$, Argon, and He.

7. The method of claim 5 wherein said third ambient comprises $O_2$.

8. The method of claim 5 wherein said third ambient comprises $N_2O$.

9. The method of claim 5 wherein said first ambient comprises nitrogen.

10. The method of claim 5 wherein said first ambient comprises oxygen.

11. A method of forming a tantalum pentaoxide dielectric film comprising:
depositing a amorphous tantalum oxide dielectric film utilizing a tantalum organic precursor;
heating said substrate to a temperature between 400°–650° C. for a first period of time;
heating said substrate to a temperature between 750°–850° C. in an inert ambient for a second period of time; and
heating said substrate to a temperature between 750°–850° C. in an ambient comprising oxygen for a third period of time.

12. A method of forming a metal insulator silicon (MIS) capacitor comprising:
forming a polysilicon bottom electrode on a substrate;
forming a thin silicon nitride film on said polysilicon bottom electrode;
forming an amorphous metal oxide dielectric on said silicon nitride film by thermal chemical vapor deposition utilizing a metal organic precursor;
heating said substrate to a temperature less than the crystallization temperature of said metal oxide dielectric in an ambient;
after heating said substrate to a temperature less than the crystallization temperature, heating said substrate to a temperature greater than the crystallization temperature of said metal organic film in an inert ambient to convert said amorphous metal oxide dielectric to a crystalline metal oxide dielectric; and
after heating said substrate to a temperature greater than said crystallization temperature in an inert ambient, heating said substrate to a temperature greater than said crystallization temperature of said metal oxide dielectric in an oxygen containing ambient; and
forming a top electrode on said crystalline metal oxide dielectric.

13. A method of forming a metal insulator metal (MIM) capacitor comprising:
forming a bottom metal electrode on a substrate;
forming an amorphous metal oxide dielectric utilizing a metal organic precursor on said bottom metal electrode;
heating said substrate to a temperature less than the crystallization temperature of said metal oxide dielectric in an ambient comprising oxygen;
after heating said substrate to a temperature less than the crystallization temperature in an oxygen ambient, heating said substrate to a temperature greater than the crystallization temperature of said metal oxide dielectric in an inert ambient to convert said amorphous metal oxide dielectric to a crystalline metal oxide dielectric; and
forming a top electrode over said crystalline metal oxide dielectrode.

14. The method of claim 13 wherein said ambient comprising oxygen formed during said heating of said substrate to a temperature less than the crystallization temperature comprises activated oxygen atoms formed by a remote plasma.

15. The method of claim 13 wherein said ambient comprising oxygen formed during said heating of said substrate to a temperature less than the crystallization temperature is formed by UV excited ozone ($O_3$).

16. The method of claim 13 wherein said ambient comprising oxygen formed during said heating of said substrate to a temperature less than the crystallization temperature comprises oxygen atoms activated by a plasma.

* * * * *